(12) United States Patent
Yeh et al.

(10) Patent No.: US 10,607,981 B2
(45) Date of Patent: Mar. 31, 2020

(54) LAYOUT PATTERN FOR STATIC RANDOM ACCESS MEMORY

(71) Applicant: UNITED MICROELECTRONICS CORP., Hsin-Chu (TW)

(72) Inventors: Shu-Wei Yeh, Taichung (TW);
Chang-Hung Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/101,528

(22) Filed: Aug. 13, 2018

(65) Prior Publication Data

US 2020/0027869 A1   Jan. 23, 2020

(30) Foreign Application Priority Data

Jul. 20, 2018 (CN) .......................... 2018 1 0801484

(51) Int. Cl.
| | |
|---|---|
| *H01L 27/02* | (2006.01) |
| *G11C 11/412* | (2006.01) |
| *H01L 27/11* | (2006.01) |
| *G11C 11/417* | (2006.01) |
| *G11C 8/16* | (2006.01) |

(52) U.S. Cl.
CPC ............ *H01L 27/0207* (2013.01); *G11C 8/16* (2013.01); *G11C 11/412* (2013.01); *G11C 11/417* (2013.01); *H01L 27/11* (2013.01)

(58) Field of Classification Search
CPC ....... H01L 27/0207; H01L 27/11; G11C 8/16; G11C 11/412; G11C 11/417
See application file for complete search history.

(56) References Cited

U.S. PATENT DOCUMENTS

| | | |
|---|---|---|
| 8,675,397 B2 | 3/2014 | Liaw |
| 9,012,287 B2 | 4/2015 | Liaw |
| 9,858,985 B2 | 1/2018 | Liaw |
| 2014/0254246 A1* | 9/2014 | Liaw .................. H01L 29/6681 365/154 |
| 2017/0110182 A1* | 4/2017 | Liaw ........................ G11C 8/16 |
| 2018/0182766 A1* | 6/2018 | Huang ............... H01L 27/1211 |
| 2018/0323117 A1* | 11/2018 | Paul ....................... H01L 22/34 |
| 2018/0331202 A1* | 11/2018 | Li .......................... B82Y 10/00 |
| 2019/0164890 A1* | 5/2019 | Yeoh ................... H01L 23/5283 |

* cited by examiner

*Primary Examiner* — Fernando L Toledo
*Assistant Examiner* — Neil R Prasad
(74) *Attorney, Agent, or Firm* — Winston Hsu (57) ABSTRACT

The present invention provides a layout pattern of a static random access memory (SRAM), comprising at least one substrate, two SRAM units on the substrate, respectively located in a first region and a second region which is adjacent to the first region. Each of the SRAM units includes a first inverter coupled to a second inverter and configured to form a latching circuit, the first inverter includes a first pull-up transistor (PU1) and a first pull-down transistor (PD1), the second inverter includes a second pull-up transistor (PU2) and a second pull-down transistor (PD2). A dummy layer crossing the first a region and the second region, and between the PD1 in the first region and the PD1 in the second region, and a contact structure on the dummy layer, electrically connected to a voltage source Vss.

18 Claims, 8 Drawing Sheets

LAYOUT PATTERN FOR STATIC RANDOM ACCESS MEMORY

BACKGROUND OF THE INVENTION

1. Field of the Invention

The invention relates to a static random access memory (SRAM), and more particularly, to a layout pattern of a static random access memory that improves the performance of pull-down transistors (PDs).

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

However, as gap of the exposure process decreases, it has been difficult for the current SRAM architecture to produce desirable patterns. Hence, how to enhance the current SRAM architecture for improving exposure quality has become an important task in this field.

SUMMARY OF THE INVENTION

The present invention provides a static random access memory (SRAM) layout pattern, the SRAM layout pattern includes a substrate, two SRAM cells are disposed on the substrate, disposed in a first region and a second region adjacent to the first region respectively, wherein each SRAM cell includes a first inverter and a second inverter coupling with each other and constituting a latch circuit, wherein the first inverter includes a first pull-up transistor (PU1) and a first pull-down transistor (PD1), the second inverter includes a second pull-up transistor (PU2) and a second pull-down transistor (PD2), a dummy layer crossing the first region and the second region, and located between the PD1 in the first region and the PD1 in the second region, and a contact structure disposed on the dummy layer and electrically connected to a voltage source Vss.

The present invention further provides a static random access memory (SRAM) layout pattern, the SRAM layout pattern includes a substrate, two SRAM cells are disposed on the substrate, disposed in a first region and a second region adjacent to the first region respectively, wherein each SRAM cell includes a first inverter and a second inverter coupling with each other and constituting a latch circuit, wherein the first inverter includes a first pull-up transistor (PU1) and a first pull-down transistor (PD1), the second inverter includes a second pull-up transistor (PU2) and a second pull-down transistor (PD2), a first dummy gate layer located in the first region and crossing over a first fin structure, a second dummy gate layer located in the second region adjacent to the first dummy gate layer and crossing over a second fin structure, wherein the first fin structure directly contacts the second fin structure, and a contact structure disposed on the first dummy layer and electrically connected to a voltage source Vss.

One embodiment of the present invention is characterized in that a dummy layer is formed in the empty space of the SRAM, and the dummy layer replaces the position of the conventional dummy gate structure. The stress layer is included under the dummy layer, so the efficiency of pull-down transistor can be improved by stress. In addition, the dummy layer is electrically connected to the voltage source Vss (on the circuit, it is in a constant off state), so that leakage current can be reduced.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
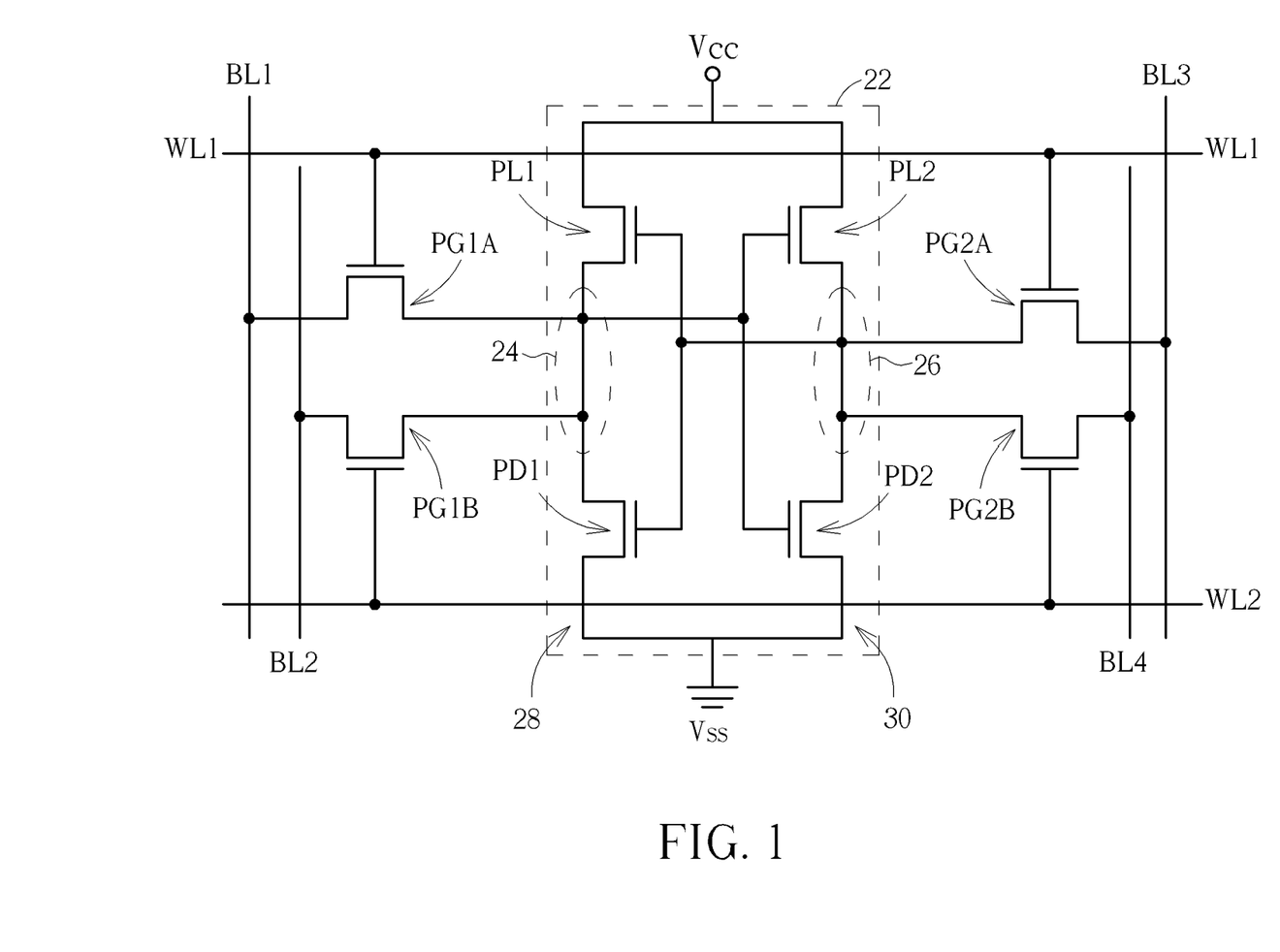
FIG. 1 illustrates a circuit diagram of an eight-transistor SRAM (8T-SRAM) cell according to a first preferred embodiment of the present invention.
Figure 2:
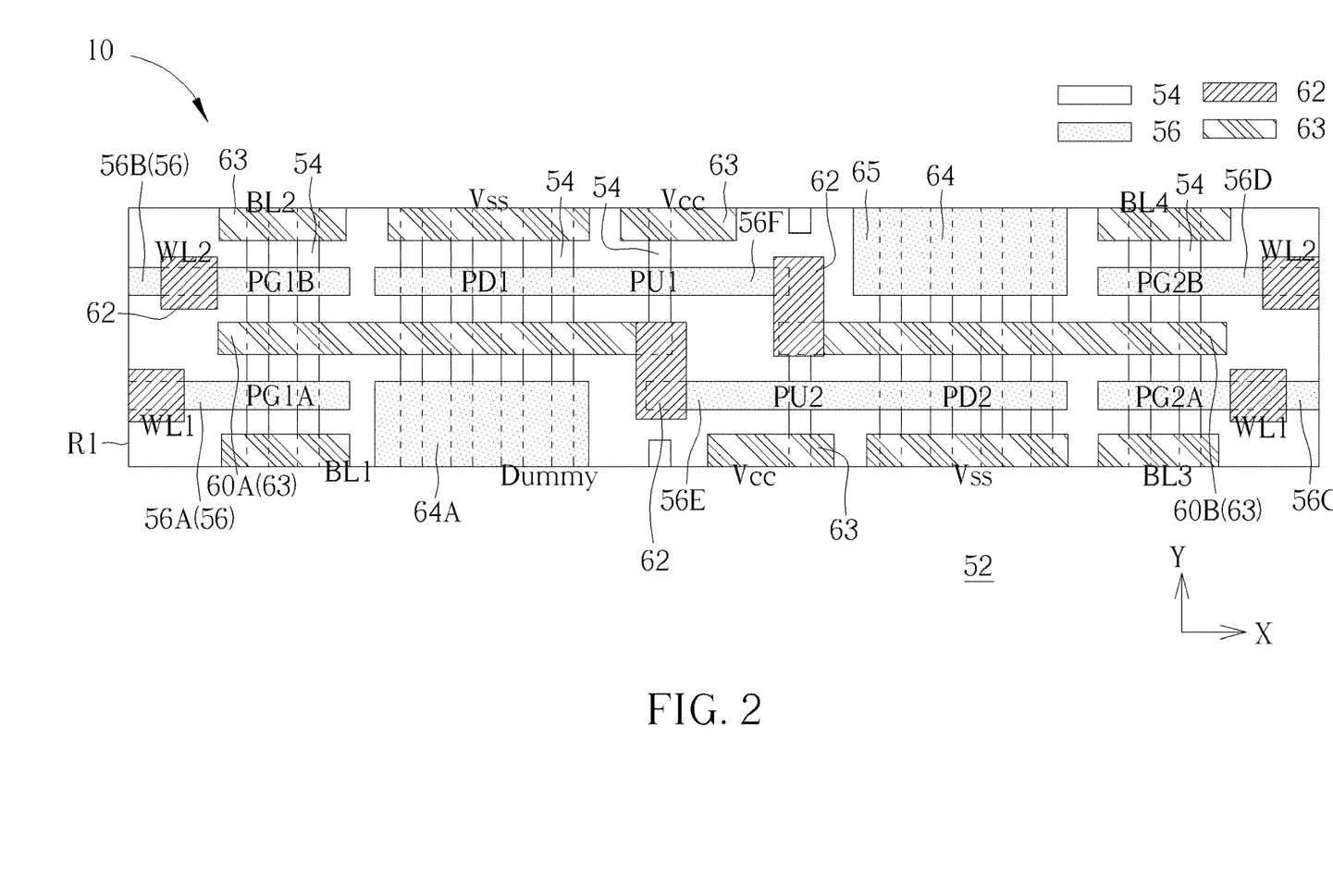
FIG. 2 illustrates a layout diagram of a SRAM according to the first preferred embodiment of the present invention.

Referring to FIGS. 1-2, FIG. 1 illustrates a circuit diagram of an eight-transistor SRAM (8T-SRAM) cell according to a first preferred embodiment of the present invention, and FIG. 2 illustrates a layout diagram of an 8T-SRAM according to the first preferred embodiment of the present invention.

As shown in FIGS. 1-2, the SRAM device of the present invention preferably includes at least one SRAM cell, each SRAM cell including an eight-transistor SRAM (8T-SRAM) cell 10.

In this embodiment, each 6T-SRAM cell 10 is composed of a first pull-up transistor PU1, a second pull-up transistor PU2, and a first pull-down transistor PD1, a second pull-down transistor PD2, a first pass gate transistor PG1A, a second pass gate transistor PG1B, a third pass gate transistor PG2A and a fourth pass gate transistor PG2B. These eight transistors constitute a set of flip-flops. The first and the second pull-up transistors PU1 and PU2, and the first and the second pull-down transistors PD1 and PD2 constitute a latch circuit 22 that stores data in the storage nodes 24 and 26. Since the first and the second pull-up transistors PU1 and PU2 act as power load devices, they can be replaced by resistors. Under this circumstance, the static random access memory becomes a four-transistor SRAM (4T-SRAM). In this embodiment, the first and the second pull-up transistors PU1 and PU2 preferably share a source/drain region and electrically connect to a voltage source (voltage node) Vcc, and the first and the second pull-down transistors PD1 and PD2 share a source/drain region and electrically connect to a voltage source (voltage node) Vss.

Preferably, the first and the second pull-up transistors PU1 and PU2 of the 6T-SRAM cell 10 are composed of p-type metal oxide semiconductor (PMOS) transistors; the first and the second pull-down transistors PD1 and PD2, the first pass gate transistors PG1A, the second pass gate transistors PG1B, the third pass gate transistors PG2A and the fourth pass gate transistors PG2B composed of n-type metal oxide semiconductor (NMOS) transistors, but not limited thereto. The first pull-up transistor PU1 and the first pull-down transistor PD1 constitute an inverter, which further form a series circuit 28. One end of the series circuit 28 is connected to a voltage source Vcc and the other end of the series circuit 28 is connected to a voltage source Vss. Similarly, the second pull-up transistor PU2 and the second pull-down transistor PD2 constitute another inverter and a series circuit 30. One end of the series circuit 30 is connected to the voltage source Vcc and the other end of the series circuit 30 is connected to the voltage source Vss. Each pass gate transistors (including the first pass gate transistor PG1A, the second pass gate transistor PG1B, the third pass gate transistor PG2A and the fourth pass gate transistor PG2B) configured with the two cross-coupled inverters respectively, wherein each of the at least one pull-up transistor (PLs), the at least one pull-down transistors (PDs), and the at least two pass gate transistor (PGs) includes a fin field-effect transistor (FinFET).

The storage node 24 is connected to the respective gates of the second pull-down transistor PD2 and the second pull-up transistor PU2. The storage node 24 is also connected to the drain of the first pull-down transistor PD1, the drain of the first pull-up transistor PU1, the drain of the first pass gate transistor PG1A and the drain of the second pass gate transistor PG1B. Similarly, the storage node 26 is connected to the respective gates of the first pull-down transistor PD1 and first the pull-up transistor PU1. The storage node 26 is also connected to the drain of the second pull-down transistor PD2, the drain of the second pull-up transistor PU2, the drain of the third pass gate transistor PG2A and the drain of the fourth pass gate transistor PG2B. The gates of the first pass gate transistor PG1A and the third pass gate transistor PG1B are respectively coupled to a first word line (WL1); the gates of the second pass gate transistor PG1B and the fourth pass gate transistor PG2B are respectively coupled to a second word line (WL2); the source of the first pass gate transistor PG1A is coupled to a first bit line (BL1); the source of the second pass gate transistor PG1B is coupled to a second bit line (BL2); the source of the third pass gate transistor PG2A is coupled to a third bit line (BL3); and the source of the fourth pass gate transistor PG2B is coupled to a fourth bit line (BL4).

Please refer to FIG. 2, in this embodiment, an 8T-SRAM cell 10 is disposed in a first region R1 and disposed on a substrate 52, such as a silicon substrate or silicon-on-insulator (SOI) substrate. The substrate may be a planar substrate, or a plurality of fin structures 54 may be formed on the substrate 52. The fin structures are arranged parallel with each other. In this embodiment, take an 8T-SRAM with fin structures 54 as an example, but the present invention is not limited thereto. In another case, the planar SRAM (the SRAM without comprising fin structures) may also be comprised within the scope of the present invention. In addition, a shallow trench isolation (STI, not shown) is disposed between each fin structure 54.

In addition, a plurality of gate structures 56 are formed on the substrate 52. Each transistor (including the first pull-up transistor PU1, the first pull-down transistor PD1, the second pull-up transistor PU2, the second pull-down transistor PD2, the first pass gate transistor PG1A, the second pass gate transistor PG1B, the third pass gate transistor PG2A, and the fourth pass gate transistor PG2B mentioned above) comprises a gate structure 56 crossing over at least one fin structure 54, to form the transistors.

As shown in FIG. 2, in order to clearly define the position of each gate structure 56, the gate structure 56 is labeled to a first gate structure 56A, a second gate structure 56B, a third gate structure 56C, a fourth gate structure 56D, a fifth gate structure 56E and a sixth gate structure 56F. The first gate structure 56A crosses over the fin structure 54 to form the first pass gate transistor PG1A; the second gate structure 56B crosses over the fin structure 56B to form the second pass gate transistor PG1B; the third gate structure 56C crosses over the fin structure 54 to form the third pass gate transistor PG2A; the fourth gate structure 56D crosses over the fin structure 54 to form the fourth pass gate transistor PG2B; the fifth gate structure 56E crosses over at least two fin structures 54, to form the second pull-up transistor PU2 and the second pull-down transistor PD2; the sixth gate structure 56F crosses over at least two fin structures 54, to form the first pull-up transistor PU1 and the first pull-down transistor PD1. It is to be understood that all of the first gate structure 56A to the sixth gate structure 56F belong to the gate structure 56.

In the present invention, each gate structure 56 is arranged in a first direction (e.g., an X-axis), and each fin structure 54 is arranged in a second direction (e.g., Y-axis). Preferably, the first direction and the second direction are perpendicular to each other.

The present invention further comprises a first local interconnection layer 60A and a second local interconnection layer 60B arranged in a first direction. The first local interconnection layer 60A crosses over the fin structure 54 of the first pull-up transistor PU1, the fin structure 54 of the first pull-down transistor PD1, the fin structure 54 of the first pass gate transistor PG1A and the fin structure 54 of the second pass gate transistor PG1B. The second local interconnection layer 60B crosses the fin structure 54 of the second pull-up transistor PU2, the fin structure 54 of the second pull-down transistor PD2, the fin structure 54 of the third pass gate transistor PG2A, and the fin structure 54 of the fourth pass gate transistor PG2B.

In addition, a plurality of contact plugs 62 and a plurality of contact layers 63 are formed on the substrate 52, the contact plugs 62 and the contact layers 63 are used to connect different transistors (e.g., a gate of the second pull-up transistor PU2 and drain of the first pull-up transistor PU1 are connected to each other through the contact plug 62 and the contact layer 63), or used to connect the transistors to other elements (e.g., a source of the first pull-up transistor PU1 is connected to the voltage source Vcc). In FIG. 2, the elements that connected to each contact plug or each contact layer (for example, the voltage source Vcc, the voltage source Vss, the first word line WL1, the second word line WL2, the first bit line BL1, the second bit line BL2, the third bit line BL3, and the fourth bit line BL4) are labeled on each contact plug 62 or each contact layer 63 directly, to clearly represent the corresponding elements of the contact plugs 62 and the contact layers 63.

Figure 3:
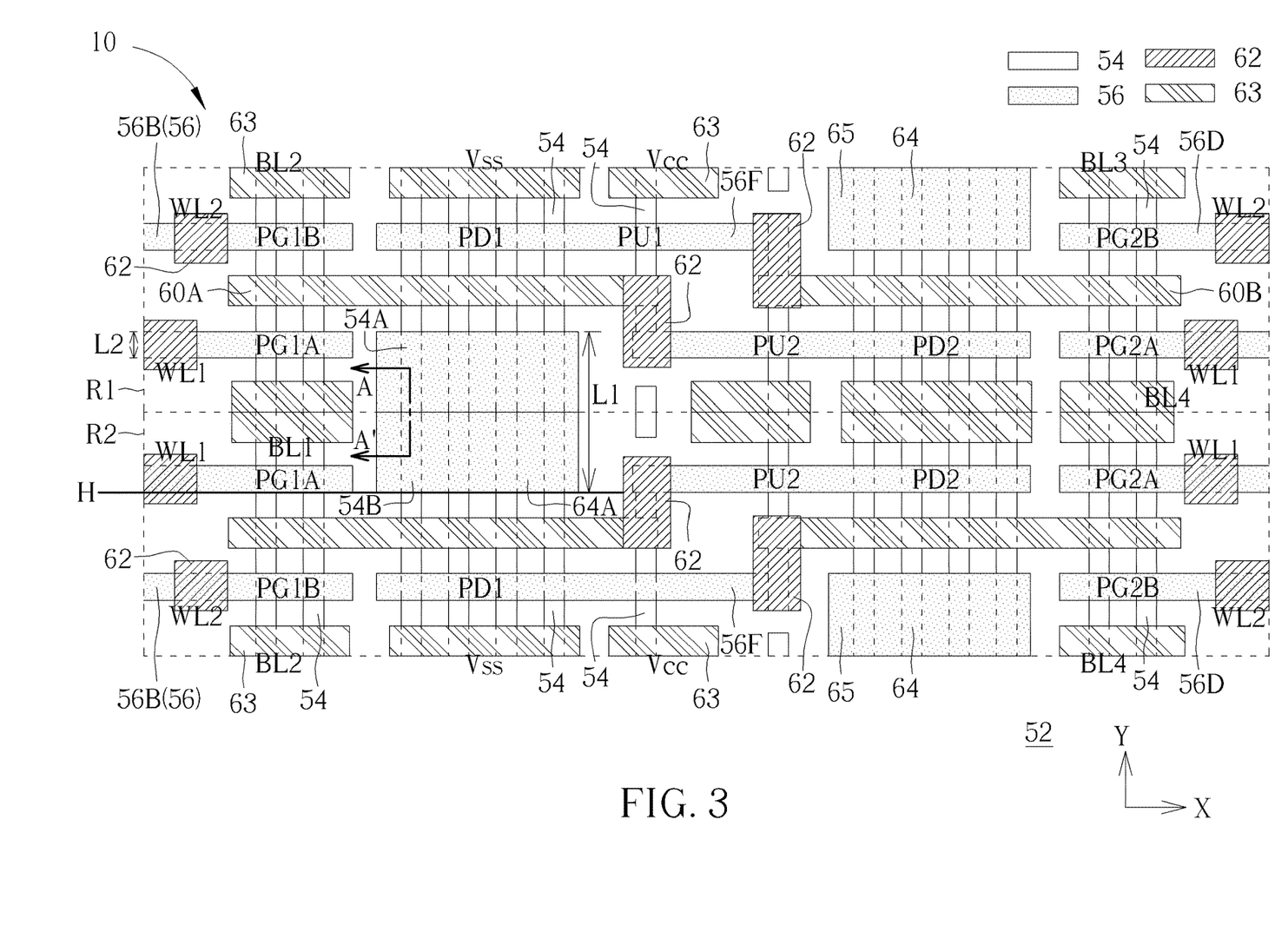
FIG. 3 shows a layout diagram of two adjacent 8TDP-SRAM memory cells.

Please refer to FIG. 3, which shows a layout diagram of two adjacent 8TDP-SRAM memory cells 10. In order to clearly describe the components, only one 8TDP-SRAM cell is shown in the above-mentioned FIG. 2, and the 8TDP-SRAM cell is formed in a first region R1. FIG. 3 focuses on the correlation between two adjacent 8TDP-SRAM cells. Therefore, the reference numerals of some of the elements will be omitted from FIG. 3, but it is worth noting that in FIG. 2 and FIG. 3, elements having the same properties contain the same mesh. For example, all gate structures and dummy layers are depicted on the same mesh bottom, and all contact plugs are also depicted on the same mesh bottom. The remaining elements depicted in the present invention are also in accordance with this rule.

In FIG. 3, two adjacent 8TDP-SRAM cells 10 are respectively located in the first region R1 and the second region R2, the elements in the two regions are mirror-symmetrically distributed, and thus the same elements are not repeatedly described. A feature of the present invention is that, except for the elements already described above, each 8TDP-SRAM cell 10 further includes at least one dummy layer 64, the dummy layer 64 is an integrally formed structure having the same material as the gate structure 56, such as polycrystalline silicon. In this embodiment, the dummy layer 64 replaces the position of the originally dummy gate in the 8TDP-SRAM. More specifically, in the layout pattern of a conventional 8TDP-SRAM, after forming each transistor (for example, PU1, PD1, . . . ), some regions do not form a desired transistor, but in order to make the overall device density uniform, some dummy gates may be formed in the empty region. In fact, the dummy gates are not used as transistors. And the dummy layer 64 of this embodiment is formed at the position of the dummy gate.

The dummy layer 64A crosses the first region R1 and the second region R2, and other dummy layers also cross the first region R1 (or the second region R2) and other regions adjacent thereto (not shown). Taking the dummy layer 64A as an example, the first local interconnection layer 60A is located between the dummy layer 64A and the sixth gate structure 56F. A length L1 of the dummy layer 64A is much larger than the length L2 of other gate structures 56, the lengths L1, L2 are extend in the Y direction, that is, a direction perpendicular to the extending direction (X axis) of the gate structure. In the present embodiment, the length L1 of the dummy layer 64A is greater than ten times the length L2 of the gate structure 56, that is, L1/L2>10. Preferably, along the horizontal direction (X-axis), one side of the dummy layer 64A is aligned with one side of the first gate structure 56A and one side of the fifth gate structure 56E (for example, the horizontal line H illustrated in FIG. 3).

Figure 4:
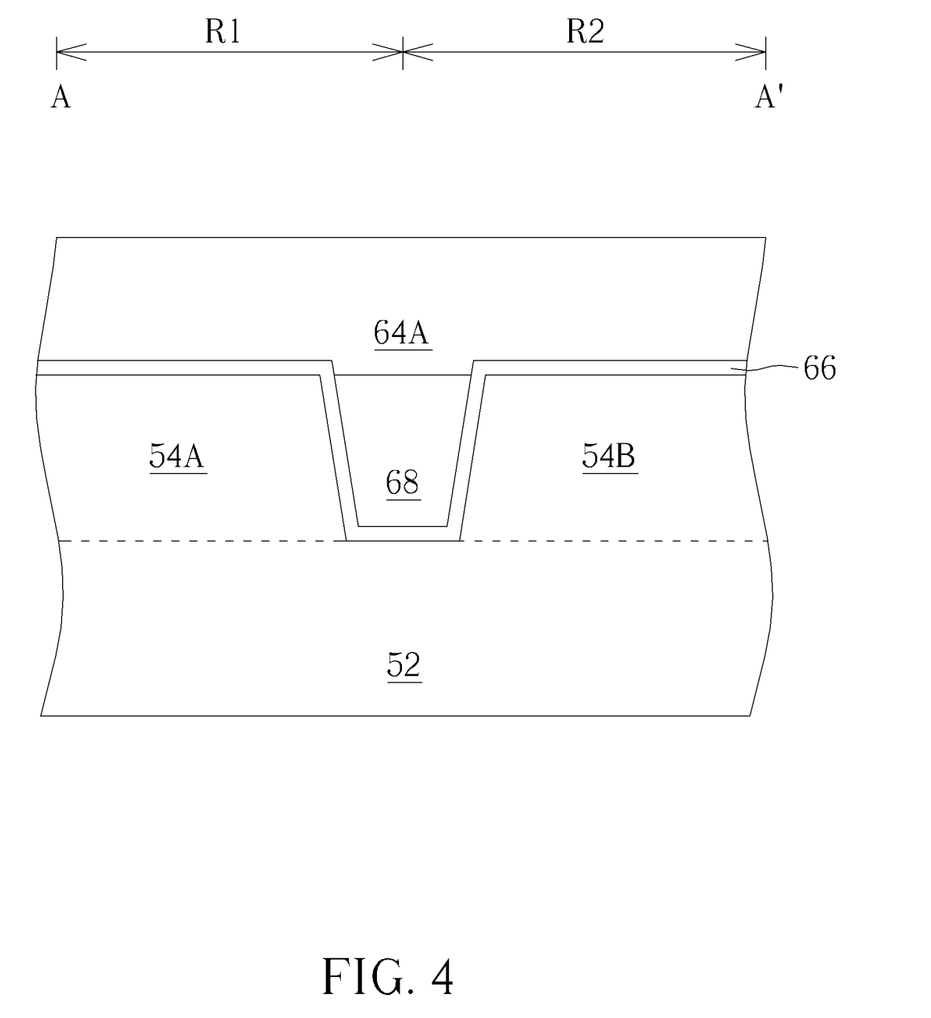
FIG. 4 shows the cross-sectional structure taken along the section line A-A' in FIG. 3.

The features of the dummy layer 64 (64A) are further described below. Please refer to FIG. 4, which shows the cross-sectional structure taken along the section line A-A' in FIG. 3. As shown in FIG. 4, the dummy layer 64A crosses the first region R1 and the second region R2 and is located between the plurality of fin structures 54. For example, a portion of the fin structure 54 within the first region R1 in FIG. 3 is defined as a fin structure 54A, and a portion of the fin structure 54 within the second region R2 is defined as a fin structure 54B. The dummy layer 64A is located above the fin structure 54A and the fin structure 54B. In addition, as shown in FIG. 4, a stress layer 68 (for example, a silicon nitride layer) is further included between the fin structure 54A and the fin structure 54B, and optionally includes a liner 66 (such as silicon oxide), for example, the liner 66 is disposed between the stress layer 68 and the substrate 52. In addition, in this embodiment, the top surface of the stress layer 68 is lower than the top surface of the fin structures 54A, 54B, but the present invention is not limited thereto. In this embodiment, the dummy layer 64 and the stress layer 68 constitute a single diffusion break (SDB) structure, and the stress layer 68 can provide, for example, tensile stress to the fin structures 54A, 54B. Conducted to the first pull-down transistor PD1 (n-type transistor), thus enhancing the performance of the first pull-down transistor PD1.

Figure 5:
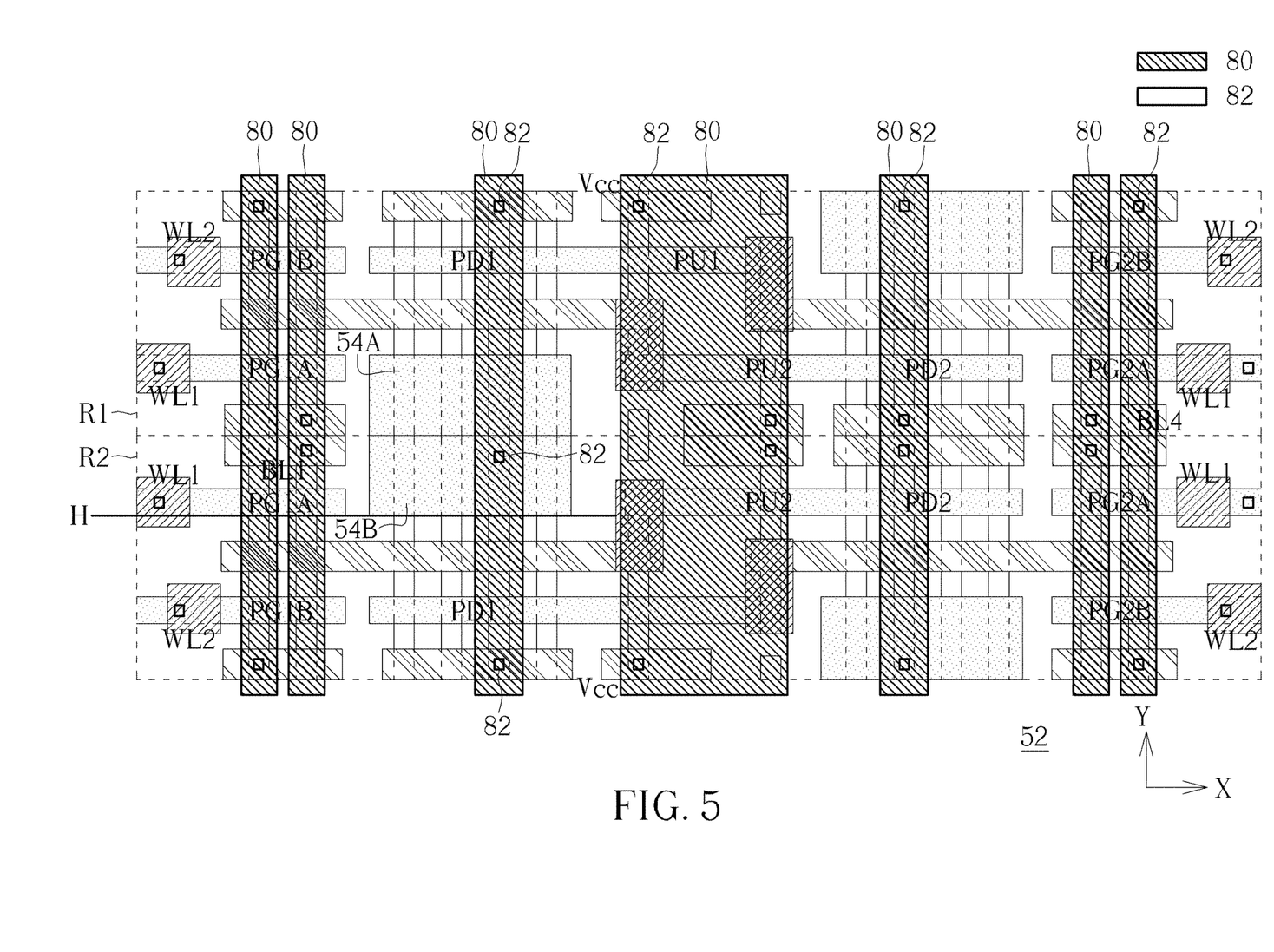
FIG. 5 shows the layout of the structure above the layer shown in FIG. 3.

Please continue to refer to FIG. 5, which shows the layout of the structure above the layer shown in FIG. 3. It is worth noting that the structure shown in FIG. 3 (including the first pull-up transistor PU1, the first pull-down transistor PD1, the second pull-up transistor PU2, the second pull-down transistor PD2, the first access transistor PG1A, the second access transistor PG1B, the third access transistor PG2A, and the fourth access transistor PG2B) are formed in a same structural layer (for example, a dielectric layer). Next, on the dielectric layer, other dielectric layers are formed, and a plurality of elements are formed in the upper dielectric layers, such as contact structures or wire structures. As shown in FIG. 5, a plurality of metal traces 80 are connected to respective contact plugs 62 or contact layers 63 in the lower dielectric layer by a plurality of via structures 82. It should be noted that although the dummy layer 64 is not used as a transistor, in the present embodiment, the dummy layer 64 is electrically connected to the voltage source Vss through the contact structure 82 and the metal trace 80. It represents that the dummy layer 64 is in a constant off state in the circuit diagram. Applicants have found that the above-mentioned connection method can effectively reduce the leakage current generated during the operation of the SRAM.

In the subsequent steps, other dielectric layers, contact structures, metal layers, and the like are formed to be stacked over the above elements. Since the present invention does not limit the shape, the number, and the like of the subsequent contact structure and the metal layer, it will not be described herein.

In summary, the present invention is characterized in that a dummy layer is formed in the empty space of the SRAM, and the dummy layer replaces the position of the conventional dummy gate structure. The stress layer is included under the dummy layer, so the efficiency of pull-down transistor can be improved by stress. In addition, the dummy layer is electrically connected to the voltage source Vss (on the circuit, it is in a constant off state), so that leakage current can be reduced.

The following description will detail the different embodiments of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 6:
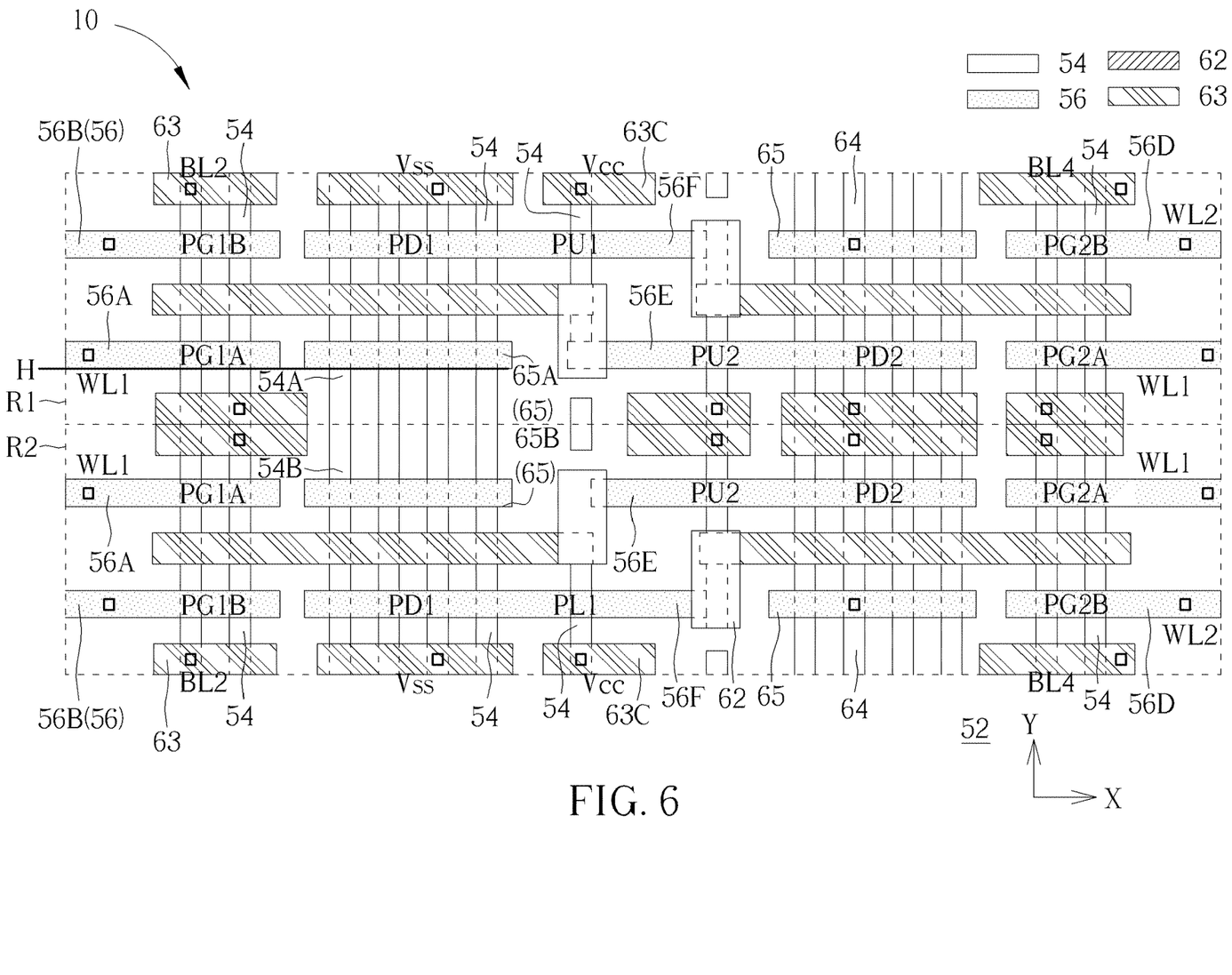
FIG. 6 illustrates a layout diagram of a SRAM according to the second preferred embodiment of the present invention.

Please refer to FIG. 6, which illustrates a layout pattern of a static random access memory (SRAM) according to a second preferred embodiment of the present invention. As shown in FIG. 6, the two 8TDP-SRAM cells 10 are respectively disposed in a first region R1 and a second region R2, and are disposed on a substrate 52. The substrate 52 is provided with a plurality of fin structures 54 arranged in parallel with each other. And shallow trench isolation (not shown) may be formed and surrounding each fin structure 54.

In addition, the layout pattern of a SRAM further comprises a plurality of gate structures 56, contact plugs 62 and contact layers 63. The gate structures 56 cross the fin structures 54 and constitutes transistors (including a first pull-up transistor PU1, a first pull-down transistor PD1, a second pull-up transistor PU2, a second pull-down transistor PD2, an first access transistor PG1A, a second access transistor PG1B, a third access transistor PG2A, and a fourth access transistor PG2B).

The components described above are the same as those of the first preferred embodiment (shown in FIG. 2 or FIG. 3), so will not be further described here. The difference between this embodiment and the first preferred embodiment is that the dummy layer is not included in the embodiment, but the dummy gate structure 65 is included. That is, the first local interconnection layer 60A is located between the dummy gate structure 65 and the sixth gate structure 56F. The dummy gate structure 65 is not used as a transistor, but is preferably formed together with each of the gate structures 56 described above. In order to clearly indicate the position of the component, a dummy gate structure in the first region R1 is labeled as a dummy gate structure 65A, and a dummy gate structure in the second region R2 is labeled as a dummy gate structure 65B. The dummy gate structure 65A crosses the fin structure 54A, and the dummy gate structure 65B crosses the fin structure 54B. In addition, in the horizontal direction (X-axis), one side of the first gate structure 56A, one side of the dummy gate structure 65A, and one side of the fifth gate structure 56E are aligned with each other (for example, as depicted in the horizontal line H shown in FIG. 6).

Figure 7:
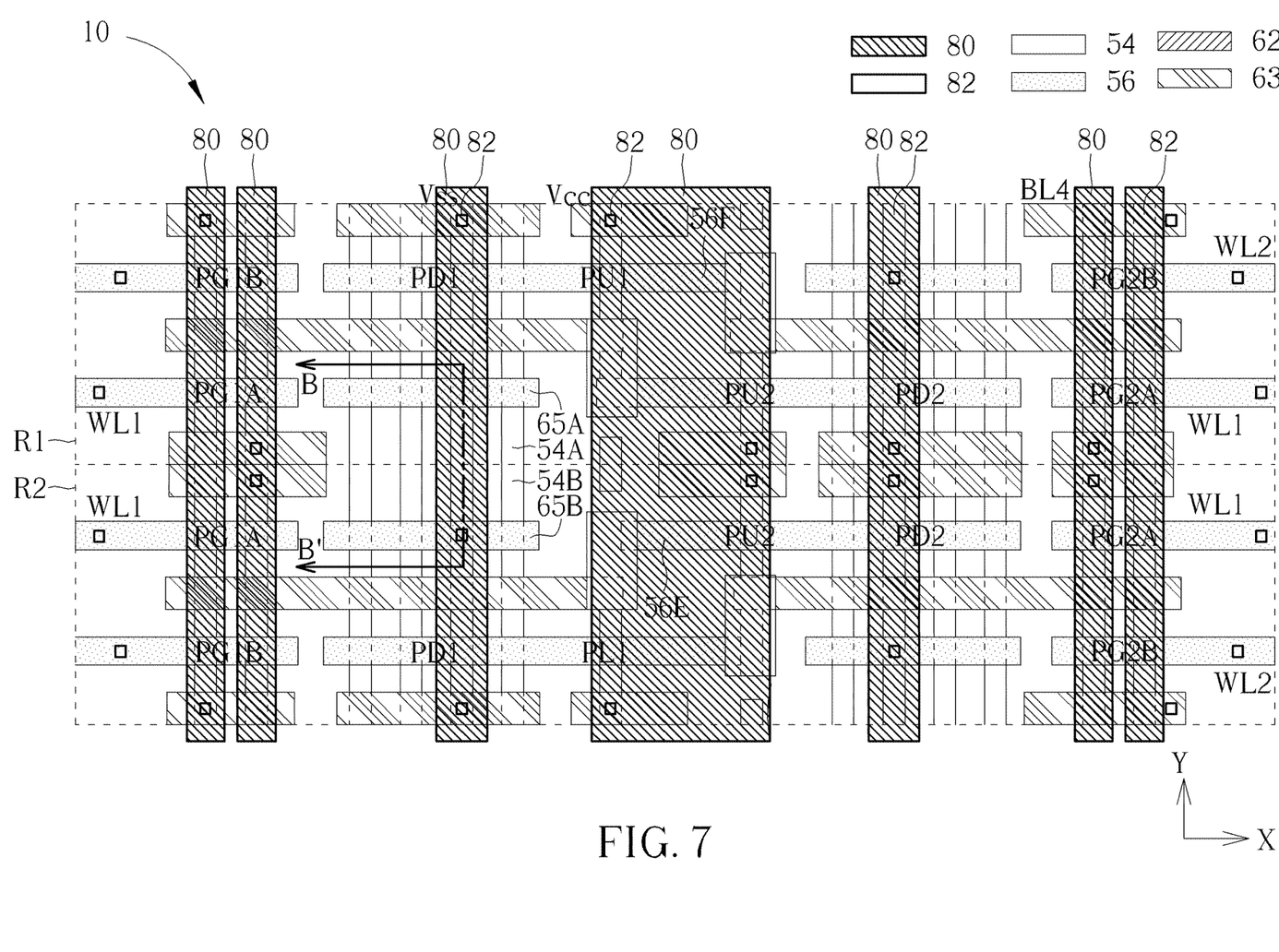
FIG. 7 shows the layout of the structure above the layer shown in FIG. 6.

In the present embodiment, the fin structure 54A is in direct contact with the fin structure 54B, in other words, the fin structures (54A and 54B) within the adjacent regions are directly connected without being separated. Next, please refer to FIG. 7, which shows the layout of the structure disposed above the layer shown in FIG. 6. The structure shown in the above FIG. 6 (including the first pull-up transistor PU1, the first pull-down transistor PD1, the second pull-up transistor PU2, the second pull-down transistor PD2, the first access transistor PG1A, the second access transistor PG1B, the third access transistor PG2A, and the fourth access transistor PG2B) are formed in a same structural layer (for example, a dielectric layer). Next, on the dielectric layer, other dielectric layers are formed, and a plurality of elements such as contact structures or wire traces are formed in the upper dielectric layer. As shown in FIG. 7, a plurality of metal traces 80 are connected to respective contact plugs 62 or contact layers 63 in the lower dielectric layer by a plurality of via structures 82. It should be noted that although the dummy gate structure 65 is not used as a transistor, in the present embodiment, the dummy gate structure 65 is electrically connected to the voltage source Vss through the contact structure 82 and the metal trace 80. It represents that the dummy gate structure 65 is in a constant off state in the circuit diagram. Applicants have found that the above-mentioned connection method can effectively reduce the leakage current generated during the operation of the SRAM.

Figure 8:
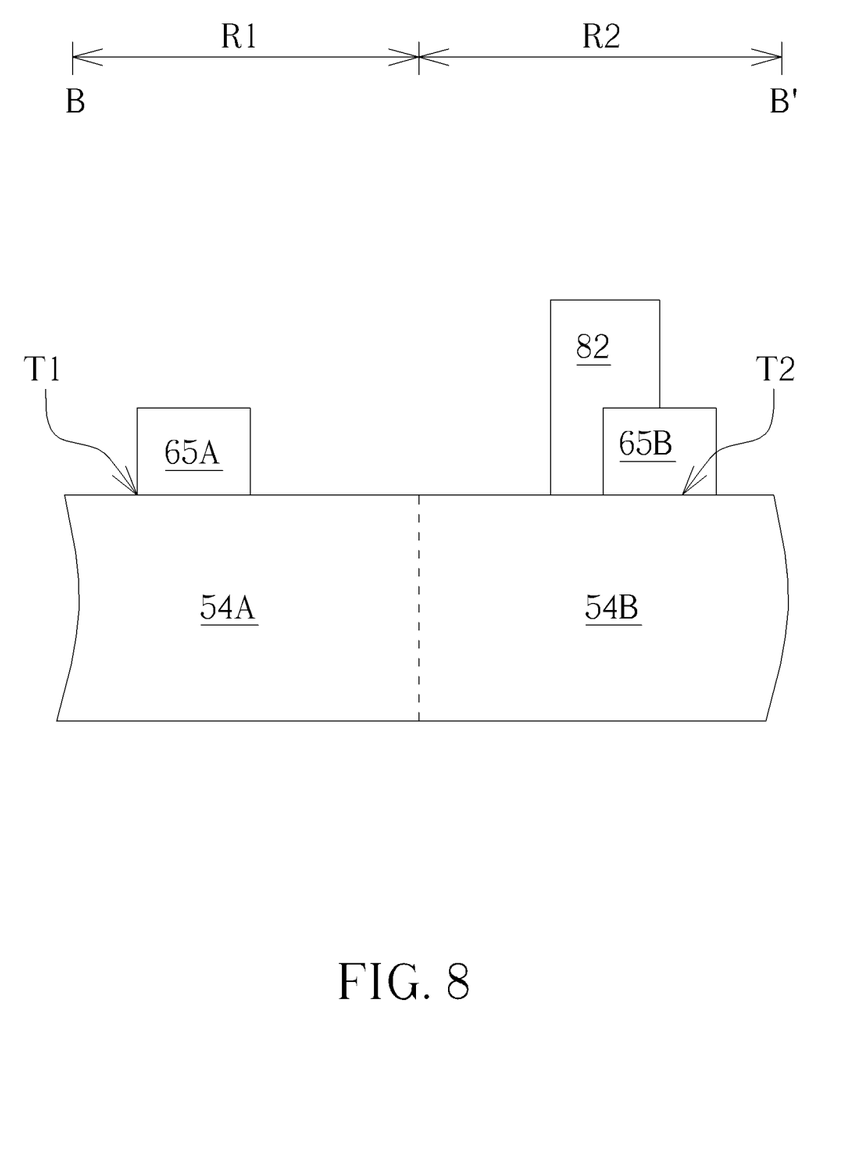
FIG. 8 shows the cross-sectional structure taken along the section line B-B' in FIG. 7.

In the conventional technology, in order to isolate components in different regions, the fin structures within two adjacent regions and between the dummy gate structures are usually separated (e.g., by lithography steps). In this embodiment, the fin structure between the dummy gate structures is directly contacted and not cut in the adjacent region, and then connected to the voltage source Vss (in the circuit diagram, it represents constant off state) to reduce the leakage current. Please also refer to FIG. 8, which shows the cross-sectional structure taken along the section line B-B' in FIG. 7. As shown in FIG. 8, the fin structures (54A, 54B) between the first region R1 and the second region R2 are not cut, but remain intact. In addition, the top surface of the fin structure 54A is defined as T1, the top surface of the fin structure 54B is defined as T2, and the top surface T1 is aligned with the top surface T2. Except for the above features, other features, material characteristics, and manufacturing methods of the remaining components are similar to those of the first preferred embodiment described above, and thus are not described herein again.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory (SRAM) layout pattern, comprising:
   a substrate;
   two SRAM cells are disposed on the substrate, disposed in a first region and a second region adjacent to the first region respectively, wherein each SRAM cell includes a first inverter and a second inverter coupling with each other and constituting a latch circuit, wherein the first inverter includes a first pull-up transistor (PU1) and a first pull-down transistor (PD1), the second inverter includes a second pull-up transistor (PU2) and a second pull-down transistor (PD2);
   a dummy layer crossing the first region and the second region, and located between the PD1 in the first region and the PD1 in the second region; and
   a contact structure disposed on the dummy layer and electrically connected to a voltage source Vss.

2. The static random access memory layout pattern of claim 1, wherein the PD1 in the first region comprises a first gate, a gate length of the first gate is defined as L1, and a length of the dummy layer is defined as L2, wherein L2/L1 is larger than 10.

3. The static random access memory layout pattern of claim 1, further comprising a first structural layer, wherein in the first region, the PU1, the PD1, the PU2, the PD2, and the dummy layer are located in the first structural layer.

4. The static random access memory layout pattern of claim 3, further comprising a first metal trace electrically connecting the contact structure and the voltage source Vss, and the first metal trace is located in a second structural layer (M1), and the second structural layer is located on the first structural layer.

5. The static random access memory layout pattern of claim 1, wherein the dummy layer is located on a fin structure, and the fin structure comprises a first portion located in the first region and a second portion located in the second region.

6. The static random access memory layout pattern of claim 5, further comprising a stress layer disposed under the dummy layer, and the stress layer is located between the first portion and the second portion.

7. The static random access memory layout pattern of claim 6, wherein the stress layer provides a stress to the PD1 in the first region and to the PD1 in the second region.

8. The static random access memory layout pattern of claim 1, wherein each of the SRAM cells further comprises a first access transistor (PG1A), a second access transistor (PG1B), a third access transistor (PG2A) and a fourth access transistor (PG2B), electrically connected to the latch circuit respectively.

9. The static random access memory layout pattern of claim 8, wherein when viewed in a top view, the PG1A comprises a second gate layer, the PU2 comprises a third gate layer, and one side of the second gate layer, one side of the third gate layer, and one side of the dummy layer are aligned with each other.

10. The static random access memory layout pattern of claim 1, wherein each of the SRAM cells is an eight transistors dual-port static random access memory (8T-dual port SRAM).

11. The static random access memory layout pattern of claim 1, wherein the dummy layer is an integrally formed structure.

12. A static random access memory (SRAM) layout pattern, comprising:
a substrate;
two SRAM cells are disposed on the substrate, disposed in a first region and a second region adjacent to the first region respectively, wherein each SRAM cell includes a first inverter and a second inverter coupling with each other and constituting a latch circuit, wherein the first inverter includes a first pull-up transistor (PU1) and a first pull-down transistor (PD1), the second inverter includes a second pull-up transistor (PU2) and a second pull-down transistor (PD2);
a first dummy gate layer located in the first region and crossing over a first fin structure;
a second dummy gate layer located in the second region adjacent to the first dummy gate layer and crossing over a second fin structure, wherein the first fin structure directly contacts the second fin structure; and
a contact structure disposed on the first dummy layer and electrically connected to a voltage source Vss.

13. The static random access memory layout pattern of claim 12, further comprising a first structural layer, wherein in the first region, the PU1, the PD1, the PU2, the PD2, and the dummy layer are located in the first structural layer.

14. The static random access memory layout pattern of claim 13, further comprising a first metal trace electrically connecting the contact structure and the voltage source Vss, and the first metal trace is located in a second structural layer (M1), and the second structural layer is located on the first structural layer.

15. The static random access memory layout pattern of claim 12, wherein when viewed in a cross section view, a top surface of the first fin structure is aligned with a top surface of the second fin structure.

16. The static random access memory layout pattern of claim 12, wherein each of the SRAM cells further comprises a first access transistor (PG1A), a second access transistor (PG1B), a third access transistor (PG2A) and a fourth access transistor (PG2B), electrically connected to the latch circuit respectively.

17. The static random access memory layout pattern of claim 16, wherein when viewed in a top view, the PG1A comprises a second gate layer, the PU2 comprises a third gate layer, and one side of the second gate layer, one side of the third gate layer, and one side of the dummy gate layer are aligned with each other.

18. The static random access memory layout pattern of claim 12, wherein each of the SRAM cells is an eight transistors dual-port static random access memory (8T-dual port SRAM).

\* \* \* \* \*